US012571845B2

(12) United States Patent
Shim et al.

(10) Patent No.: US 12,571,845 B2
(45) Date of Patent: Mar. 10, 2026

(54) METHOD AND APPARATUS FOR CALCULATING RELATIVE STATE-OF-CHARGE OF BATTERY

(71) Applicant: Samsung SDI Co., Ltd., Yongin-si (KR)

(72) Inventors: Youngwoo Shim, Yongin-si (KR); Youngshin Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 838 days.

(21) Appl. No.: 17/871,755

(22) Filed: Jul. 22, 2022

(65) Prior Publication Data

US 2023/0039331 A1     Feb. 9, 2023

(30) Foreign Application Priority Data

Aug. 5, 2021   (KR) ........................ 10-2021-0103438

(51) Int. Cl.
*G01R 31/382*     (2019.01)
*G01R 31/36*      (2020.01)
*G01R 31/396*     (2019.01)
*H02J 7/00*       (2006.01)

(52) U.S. Cl.
CPC ....... *G01R 31/382* (2019.01); *G01R 31/3648* (2013.01); *G01R 31/396* (2019.01); *H02J 7/0048* (2020.01)

(58) Field of Classification Search
CPC .............. G01R 31/382; G01R 31/3648; G01R 31/396; G01R 31/367; G01R 31/3842; G01R 31/374; G01R 31/392; H02J 7/0048
See application file for complete search history.

(56) References Cited

U.S. PATENT DOCUMENTS

| 10,312,699 B2 * | 6/2019 | Subbaraman ....... H01M 10/488 |
| 10,983,168 B2 * | 4/2021 | Kondo ............. H01M 10/4285 |

(Continued)

FOREIGN PATENT DOCUMENTS

| KR | 10-2017-0116427 A | 10/2017 |
| KR | 10-1903581 B1 | 10/2018 |

(Continued)

OTHER PUBLICATIONS

Notice of Allowance, KR Patent Application No. 20-2021-0103438, dated Nov. 30, 2023, 2 pages.

*Primary Examiner* — Nha T Nguyen
(74) *Attorney, Agent, or Firm* — Womble Bond Dickinson (US) LLP

(57)     ABSTRACT

A method of calculating a relative state-of-charge (RSOC) of a battery according to the disclosure includes measuring at least one parameter of the battery, based on the at least one parameter, estimating a state-of-charge (SOC) of the battery, based on the SOC, SOC-open circuit voltage (SOC-OCV) data of the battery, and the at least one parameter, estimating a non-dischargeable capacity of the battery, based on the non-dischargeable capacity of the battery, the SOC, and intrinsic capacity of the battery, estimating an available SOC (AvSOC) of the battery, based on the SOC and the AvSOC of the battery, determining the RSOC of the battery, and based on a ratio of the RSOC to the AvSOC, updating the RSOC of the battery.

18 Claims, 7 Drawing Sheets

(56)       References Cited

U.S. PATENT DOCUMENTS

| | | | |
|---|---|---|---|
| 2013/0169235 A1* | 7/2013 | Patino | H01M 10/488 |
| | | | 320/136 |
| 2014/0156209 A1* | 6/2014 | Yuan | G06F 17/00 |
| | | | 702/63 |
| 2015/0212161 A1* | 7/2015 | Soga | H02J 7/00714 |
| | | | 702/63 |
| 2018/0095141 A1 | 4/2018 | Wild et al. | |
| 2018/0143252 A1* | 5/2018 | Kondo | H01M 10/4285 |
| 2019/0036356 A1 | 1/2019 | Subbaraman et al. | |
| 2019/0120911 A1* | 4/2019 | Kondo | H01M 10/0525 |
| 2020/0150183 A1 | 5/2020 | Yoon et al. | |
| 2021/0080508 A1* | 3/2021 | Kondo | H02J 7/005 |
| 2021/0405124 A1* | 12/2021 | Lan | H01M 10/48 |
| 2022/0060031 A1* | 2/2022 | Liu | H02J 7/0048 |

FOREIGN PATENT DOCUMENTS

| | | |
|---|---|---|
| KR | 10-2019-0098531 A | 8/2019 |
| KR | 10-2040880 B1 | 11/2019 |
| KR | 10-2177723 B1 | 11/2020 |

* cited by examiner

FIG. 5

| | 0.7C | | 1.0C | |
|---|---|---|---|---|
| | (a) Before | (b) After | (a) Before | (b) After |
| Discharge Time to 0% | 47m 14s | | 16m 7s | |
| Cap to 0% [mAh] | 2651 | | 1552 | |
| Start RSOC [%] | 94 | | 91 | |
| End RSOC [%] | 17 → 0% | 1 → 0% | 59 → 0% | 1 → 0% |

(a)

(b)

(a)

LOW TEMPERATURE DISCHARGE 1C Before

59%↓

State-of-Charge (%)

TIME (min)

(b)

LOW TEMPERATURE DISCHARGE 1C After

State-of-Charge (%)

TIME (min)

METHOD AND APPARATUS FOR CALCULATING RELATIVE STATE-OF-CHARGE OF BATTERY

CROSS-REFERENCE TO RELATED APPLICATION

This application claims priority to, and the benefit of, Korean Patent Application No. 10-2021-0103438, filed on Aug. 5, 2021, in the Korean Intellectual Property Office, the disclosure of which is incorporated by reference herein in its entirety.

BACKGROUND

1. Field

The disclosure relates to a method, a computer program, and an apparatus for calculating a relative state-of-charge of a battery, which may effectively calculate the relative state-of-charge of the battery in a process of calculating the relative state-of-charge of the battery.

2. Description of the Related Art

Lithium batteries have a designed intrinsic capacity, but depending on the surrounding environment, lithium batteries may not use all of the intrinsic capacity, and thus, the intrinsic capacity and available capacity generally differ. The available capacity is referred to as relative capacity, and a value obtained by smoothing the relative capacity is defined as a relative state-of-charge (RSOC, %).

The estimation of relative capacity may be useful because the relative capacity is an indicator for a user of a lithium battery to know how much lithium battery may be used. The relative capacity may be estimated by calculating an RSOC, and research on the estimation of the relative capacity of a battery is being actively conducted.

When the estimation of the relative capacity of a battery is inaccurate, the RSOC may drop sharply at the end of the battery's discharge, which may cause various problems, such as a sudden power-off of a product, and thus, various attempts have been made to improve the accuracy of the estimation of the relative capacity of a battery.

SUMMARY

The disclosure provides a solution to the problems stated above, and provides a method, a computer program, and an apparatus for calculating a relative state-of-charge (RSOC) of a battery, which may effectively reduce or prevent an RSOC plunge of the battery.

However, the discussed embodiments do not pose a limitation on the scope of the disclosure.

Additional aspects will be set forth in part in the description that follows and, in part, will be apparent from the description, or may be learned by practice of the presented embodiments of the disclosure.

A method of calculating a relative state-of-charge (RSOC) of a battery according to an aspect of the disclosure includes measuring at least one parameter of the battery, based on the at least one parameter, estimating a state-of-charge (SOC) of the battery, based on the SOC, SOC-open circuit voltage (SOC-OCV) data of the battery, and the at least one parameter, estimating a non-dischargeable capacity of the battery, based on the non-dischargeable capacity of the battery, the SOC, and intrinsic capacity of the battery, estimating an available SOC (AvSOC) of the battery, based on the SOC and the AvSOC of the battery, determining the RSOC of the battery, and based on a ratio of the RSOC to the AvSOC, updating the RSOC of the battery.

At least one parameter may include a voltage, current, and temperature of the battery.

The at least one parameter may include a discharge rate of the battery.

The estimating of the non-dischargeable capacity of the battery may include performing a discharge simulation by using the SOC, the SOC-OCV data of the battery, and the at least one parameter, and based on a remaining capacity of the battery, which corresponds to a state-of-discharge of the battery with respect to the discharge simulation, estimating the non-dischargeable capacity of the battery.

The estimating of the AvSOC of the battery may include based on a ratio of the intrinsic capacity to the non-dischargeable capacity, calculating a non-discharge rate of the battery, and calculating the AvSOC by subtracting the non-discharge rate of the battery from the SOC.

Updating of the RSOC may include calculating the ratio of the RSOC to the AvSOC, based on the ratio, determining whether correction of the RSOC is suitable, and when the correction of the RSOC is suitable, correcting the RSOC by using a dischargeable time of the battery.

The determining of whether the correction of the RSOC is suitable may include determining whether a value of the ratio is greater than a threshold value, and when the value of the ratio is greater than the threshold value, determining that the correction of the RSOC is suitable.

The updating of the RSOC may include calculating the dischargeable time, calculating an RSOC variation amount by adding a variation amount weight to a value obtained by dividing a current RSOC of the battery by the dischargeable time, and based on the RSOC variation amount, updating the RSOC.

The calculating of the dischargeable time may include calculating a time for the battery to reach a state-of-discharge from a current state by using a relative capacity of the battery and the at least one parameter.

The updating of the RSOC by using the RSOC variation amount may include determining whether the RSOC variation amount is less than a maximum RSOC variation amount, and when the RSOC variation amount is less than the maximum RSOC variation amount, updating the RSOC of the battery by using the RSOC variation amount.

Also provided is a computer program stored in a recording medium to execute the method described above by using a computing device.

An apparatus for calculating an RSOC of a battery according to an aspect of the disclosure includes a memory storing data for storing data generated by measuring at least one parameter of the battery, an intrinsic capacity of the battery, and SOC-open circuit voltage (SOC-OCV) data of the battery, and at least one processor configured to, based on the at least one parameter, estimate an SOC of the battery, based on the SOC, the SOC-OCV data, and the at least one parameter, estimate a non-dischargeable capacity of the battery, configured to, based on the non-dischargeable capacity, the SOC, and the intrinsic capacity, estimate an available SOC (AvSOC) of the battery, configured to, based on the SOC and the AvSOC, determine the RSOC of the battery, and configured to, based on a ratio of the RSOC to the AvSOC, update the RSOC.

The at least one parameter may include a voltage, current, and temperature of the battery.

3

The at least one parameter may include a discharge rate of the battery.

The non-dischargeable capacity may be estimated based on a remaining capacity of the battery, which corresponds to a state-of-discharge of the battery with respect to a discharge simulation of the battery, wherein the discharge simulation is performed by using the SOC, the SOC-OCV data, and the at least one parameter.

The AvSOC may be calculated by subtracting a non-discharge rate of the battery from the SOC, wherein the non-discharge rate is calculated based on a ratio of the intrinsic capacity to the non-dischargeable capacity.

The RSOC may be updated by using a dischargeable time of the battery when correction of the RSOC is suitable, wherein whether the correction of the RSOC is suitable is determined based on the ratio of the RSOC to the AvSOC.

The RSOC may be updated based on an RSOC variation amount of the battery, wherein the RSOC variation amount is calculated by adding a variation amount weight to a value obtained by dividing a current RSOC of the battery by the dischargeable time.

The dischargeable time may be a time for the battery to reach a state-of-discharge from a current state by using a relative capacity of the battery and the at least one parameter.

The RSOC may be updated by using the RSOC variation amount when the RSOC variation amount is less than a maximum RSOC variation amount.

BRIEF DESCRIPTION OF THE DRAWINGS

The above and other aspects of embodiments of the disclosure will be more apparent from the following description taken in conjunction with the accompanying drawings, in which:

FIGS. 5 to 7 show result data and result graphs, in which updating of an RSOC according to a discharge rate of a battery is performed, according to one or more embodiments of the disclosure.

DETAILED DESCRIPTION

Figure 1:
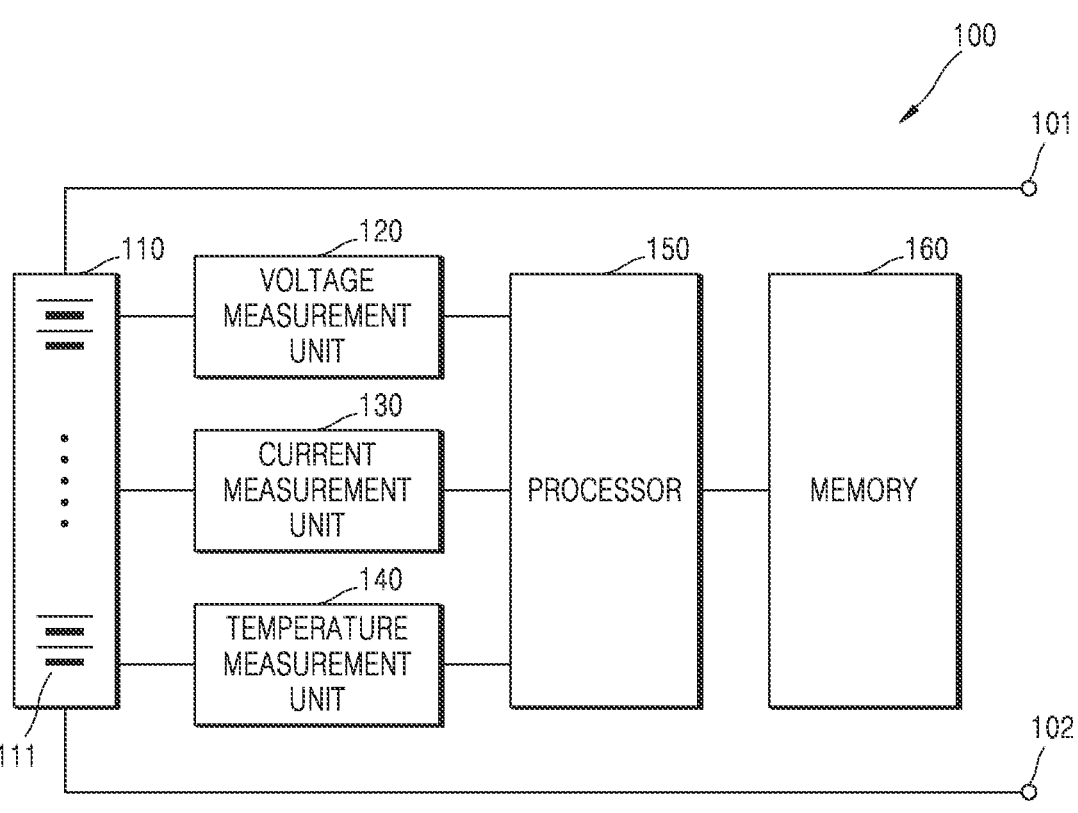
FIG. 1 schematically shows a battery pack according to one or more embodiments of the disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Some embodiments may be described in terms of functional block components and various processing steps. Some or all of such functional blocks may be realized by any number of hardware and/or software components configured to perform the specified functions. For example, functional blocks of the disclosure may be implemented by one or more microprocessors or by circuit components for a predetermined function. Functional blocks of the disclosure may be implemented with any programming or scripting language. Functional blocks of the disclosure may be implemented in algorithms that are executed on one or more processors. A function performed by a functional block in the disclosure may be performed by a plurality of functional blocks, or functions performed by a plurality of functional blocks in the disclosure may be performed by one functional block. Furthermore, the disclosure could employ any number of conventional techniques for electronics configuration, signal processing and/or control, data processing, and the like.

FIG. 1 schematically shows a battery pack according to one or more embodiments of the disclosure.

Referring to FIG. 1, a battery pack 100 includes a battery 110, a processor 150, a memory 160, a voltmeter (e.g., voltage measurement unit) 120, an ammeter (e.g., a current measurement unit) 130, and a thermometer (e.g., temperature measurement unit) 140.

The battery 110 may include at least one battery cell 111, and the battery cell 111 may be a chargeable secondary battery. For example, the battery cell 111 may include at least one selected from the group consisting of a nickel-cadmium battery, a lead storage battery, a nickel metal hydride (NiMH) battery, a lithium ion battery, a lithium polymer battery, and the like.

The number and connection method of battery cells 111 included in the battery 110 may be determined based on an amount of electric power and voltage, which are suitable for the battery pack 100. Although FIG. 1 shows, for conceptual purposes only, that battery cells 111 included in the battery 110 are connected in series, the battery cells 111 may be connected with each other in parallel or connected with each other in series and in parallel. Although FIG. 1 shows, for conceptual purposes, that battery pack 100 only includes one battery 110, the battery pack 100 may include a plurality of batteries 110 connected with each other in series, in parallel, or both in series and in parallel. The battery 110 may also include only one battery cell 111.

Each of the batteries 110 may include a plurality of battery modules including a plurality of battery cells 111. The battery pack 100 includes a pair of pack terminals 101 and 102 to which an electrical load or a charging device may be connected.

As an object that is subjected to calculation of a relative state-of-charge (RSOC) of a battery in the present specification, the battery may be the battery 110, or may be each of at least one battery cell 111 included in the battery 110. In the present specification, a method of calculating an RSOC of one battery is described, but the same may also be applied to a method of calculating an RSOC of each of a plurality of battery cells 111 included in the battery 110.

The battery pack 100 according to one or more embodiments of the disclosure may include a switch. The switch may be connected between the battery 110 and one of the pack terminals 101 and 102 (for example, the pack terminal 101). The switch may be controlled by the processor 150. In one or more embodiments, the battery pack 100 may further include a battery protection circuit, a fuse, a current sensor, and the like.

An apparatus for calculating an RSOC of a battery according to one or more embodiments of the disclosure includes the processor 150 and the memory 160.

The processor 150 controls overall operation of the apparatus for calculating an RSOC of a battery. For example, the processor 150 may be implemented in a form that selectively includes a processor known in the art, an application-specific integrated circuit (ASIC), a chipset, a logic circuit, a register, a communication modem, and/or a data processing device, so as to perform the operation described above.

The processor 150 may perform basic arithmetic, logic, and input/output operations, and may execute, for example, program code stored in the memory 160. The processor 150 may store data in the memory 160, or may load the data stored in the memory 160.

The memory 160 is a recording medium that is readable by the processor 150, and may include a permanent mass storage device, such as random access memory (RAM), read only memory (ROM), and a disk drive. The memory 160 may store an operating system and at least one program or application code. The memory 160 may store program code for calculating an RSOC of a battery, according to one or more embodiments of the disclosure. For example, the memory 160 may store data generated by measuring at least one parameter of the battery 110. Also, the memory 160 may store an intrinsic capacity value of the battery 110. Also, the memory 160 may store SOC-open circuit voltage (SOC-OCV) data of the battery 110. For example, the data may include charging/discharging current, terminal voltage and/or temperature of the battery 110. Also, the data may include a discharge rate of the battery 110. The memory 160 may store program code for estimating an SOC of the battery 110 by using data generated by measuring at least one parameter of the battery 110, and SOC-OCV data. At least one parameter of the battery 110 refers to a component or variable, such as a terminal voltage, a charging/discharging current and/or an ambient temperature of the battery 110.

The apparatus for calculating an RSOC of a battery may further include the voltmeter 120 for measuring at least one parameter of the battery 110, the ammeter 130, and the thermometer 140. The apparatus for calculating an RSOC of a battery may further include a communication module for communicating with other devices, such as an electronic control device of a vehicle, a controller of a charging device, and the like.

The voltmeter 120 may be configured to measure a voltage of the battery 110. For example, in one or more embodiments, the voltmeter 120 may be electrically connected to both ends of the battery 110 and/or the battery cell 111. Also, the voltmeter 120 may be electrically connected to the processor 150 to transmit and receive electrical signals. Also, the voltmeter 120 may measure a voltage of both ends of the battery 110 and/or the battery cell 111 at a time interval under the control by the processor 150, and may output a signal indicating a magnitude of the measured voltage to the processor 150. At this time, the processor 150 may determine the voltage of the battery 110 and/or the battery cell 111 from the signal output from the voltmeter 120. For example, the voltmeter 120 may be implemented by using a voltage measurement circuit that is generally used in the art.

Also, the ammeter 130 may be configured to measure a current of the battery 110. For example, in one or more embodiments, the ammeter 130 may be electrically connected to a current sensor provided on a charge/discharge path of the battery 110 and/or the battery cell 111. Also, the ammeter 130 may be electrically connected to the processor 150 to transmit and receive an electrical signal. Also, the ammeter 130 may repeatedly measure a magnitude of a charging current or a discharging current of the battery 110 and/or the battery cell 111 at a time interval under the control by the processor 150, and may output a signal indicating the magnitude of the measured current to the processor 150. At this time, the processor 150 may determine the magnitude of the current from the signal output from the ammeter 130. For example, the current sensor may be implemented by using a Hall sensor or sense resistor generally used in the art.

The thermometer 140 may be configured to measure a temperature of the battery 110. For example, in one or more embodiments, the thermometer 140 may be connected to the battery 110 and/or the battery cell 111 to measure a temperature of a secondary battery provided in the battery 110 and/or the battery cell 111. Also, the thermometer 140 may be electrically connected to the processor 150 to transmit and receive an electrical signal. Also, the thermometer 140 may repeatedly measure a temperature of the secondary battery at a time interval, and may output a signal indicating a magnitude of the measured temperature to the processor 150. At this time, the processor 150 may determine the temperature of the secondary battery from the signal output from the thermometer 140. For example, the thermometer 140 may be implemented by using a thermocouple generally used in the art.

Also, the processor 150 may estimate an SOC of the battery 110 by using at least one of a voltage measurement value, a current measurement value, and a temperature measurement value of the battery 110, which are received from the voltmeter 120, the ammeter 130, and the thermometer 140, respectively. Here, the SOC may be calculated as a value corresponding to a remaining amount of the battery 110 in the range of about 0% to about 100%.

According to an aspect of the disclosure, the processor 150 may estimate an SOC of the battery 110 by integrating a charging/discharging current of the battery 110. Here, when charging or discharging of the battery 110 starts, an initial value of the SOC may be determined by using an OCV of the battery 110, which may have been measured before the charging or discharging of the battery 110 began. To this end, the processor 150 may map an SOC corresponding to an OCV of the battery 110 from SOC-OCV data, based on the SOC-OCV data in which an SOC is defined for each OCV.

$$SOC = SOC_{t-1} + dSOC \qquad \text{Equation 1}$$

Here, SOC refers to the state-of-charge of a battery, $SOC_{i-1}$ refers to an initial value of the state-of-charge of the battery, and dSOC refers to a value obtained by integrating a charging/discharging current of the battery.

$$dSOC = \frac{\int i(t)dt}{\text{intinsic capacity}} \times 100\% \qquad \text{Equation 2}$$

Here, dSOC refers to a value obtained by integrating the value obtained by integrating the charging/discharging current of the battery from the start of charging or discharging, and intrinsic capacity refers to design capacity of the battery.

According to another aspect of the disclosure, the processor 150 may estimate an SOC of the battery 110 by using an extended Kalman filter. The extended Kalman filter refers to a mathematical algorithm for adaptively estimating an SOC of a secondary battery by using a voltage, current, and temperature of the secondary battery.

The SOC of the battery 110 may also be determined by other known methods by which the SOC may be estimated by selectively utilizing a voltage, current, and temperature of a secondary battery than the current integration method or extended Kalman filter described above.

Figure 2:
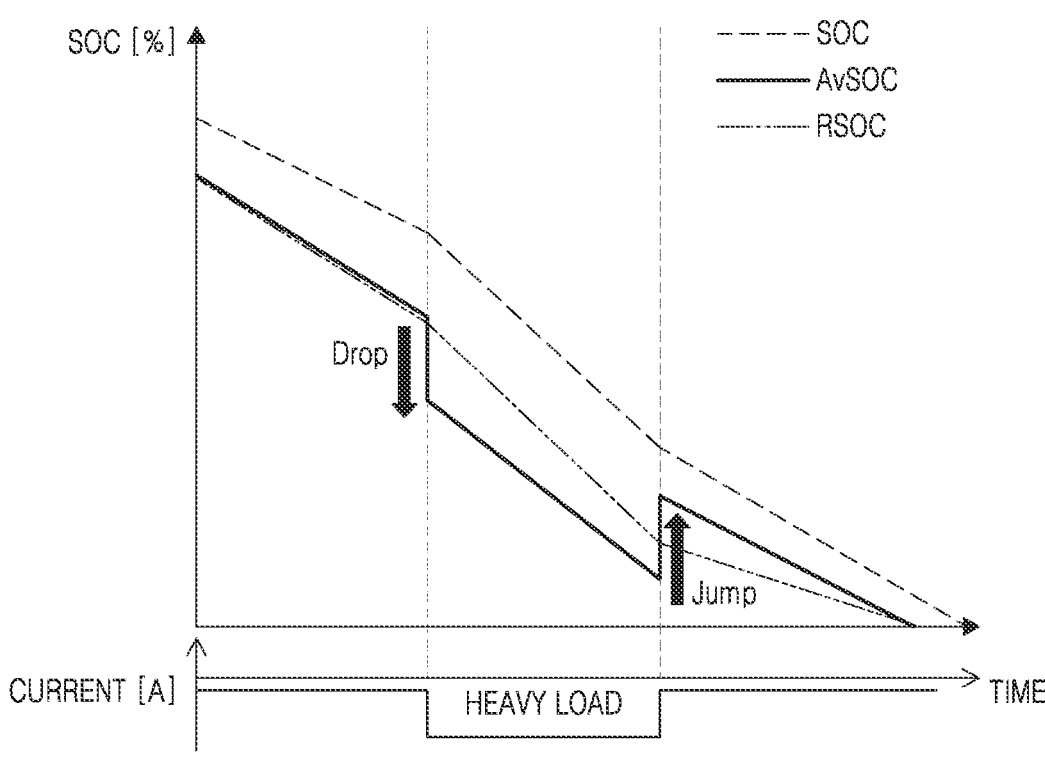
FIG. 2 is a diagram for explaining a relationship between a state-of-charge (SOC), an available SOC (AvSOC), and a relative SOC (RSOC) of a battery, according to one or more embodiments of the disclosure.

FIG. 2 is a diagram for explaining a relationship between an SOC, an available SOC (AvSOC), and an RSOC of a battery according to one or more embodiments of the disclosure.

Referring to FIG. 2, an SOC of a battery being discharged may be distinguished from an AvSOC and an RSOC of the battery.

SOC refers to the state-of-charge of a battery. For example, the SOC may indicate a value corresponding to a remaining amount of the battery in the range of about 0% to about 100%.

AvSOC refers to the available state-of-charge of the battery. For example, AvSOC may indicate a value corresponding to a currently available remaining amount of the battery, and may indicate a value that is different from the SOC depending on the surrounding environment or current state, such as temperature, a discharge rate, or non-dischargeable capacity of the battery.

$$AvSOC = SOC - \frac{\text{non-dischargeable capacity}}{\text{intrinsic capacity}} \times 100\% \qquad \text{Equation 3}$$

Here, AvSOC refers to the available state-of-charge of a battery, SOC refers to the state-of-charge of the battery, non-dischargeable capacity refers to a dischargeable remaining capacity in the current state of the battery, and intrinsic capacity refers to a design capacity of the battery.

RSOC refers to the relative state-of-charge of a battery. For example, RSOC may indicate a value corresponding to relative capacity of a battery, and may indicate a value that is different from AvSOC depending on the surrounding environment or current state, such as a temperature or a discharge rate of the battery.

$$RSOC = RSOC_{t-1} + \text{Ratio} \times dSOC \qquad \text{Equation 4}$$

Here, RSOC refers to the relative state-of-charge of a battery, RSOCi-1 refers to an initial value of the relative state-of-charge of the battery, Ratio refers to a value of a ratio of RSOC to AvSOC, and dSOC refers to a current integration value of Equation 2.

$$\text{Ratio} = \frac{RSOC_{i-1}}{AvSOC} \qquad \text{Equation 5}$$

Here, Ratio refers to a value of a ratio of RSOC to AvSOC, RSOCi-1 refers to an initial value of the relative state-of-charge of a battery, and AvSOC refers to the available state-of-charge of the battery.

For example, as shown in FIG. 2, at the beginning of discharging of the battery, SOC and AvSOC of the battery may differ by a value corresponding to non-dischargeable capacity, and AvSOC and RSOC may have the same value. When a discharge rate increases due to a sharp increase in a discharging current while the battery is being discharged, AvSOC decreases relatively sharply (e.g., "Drop"), and thus, AvSOC and RSOC may have different values. In this case, RSOC may be smoothed to track and follow AvSOC. Also, when the discharge rate decreases due to a relatively sharp decrease in the discharging current again, AvSOC increases relatively sharply (e.g., "Jump"), and RSOC is smoothed to track and follow AvSOC.

For example, when SOC of the battery being discharged is about 80%, and a non-discharge rate corresponding to the non-dischargeable capacity in the current state of the battery is about 10%, AvSOC may be about 70%. At this time, the discharge rate may increase relatively sharply, and AvSOC may decrease to about 60%, and in this case, RSOC may be displayed as about 70% instead of about 60% as a value displayed to a battery user. In this case, RSOC is smoothed to track and follow an AvSOC value. For example, RSOC may be smoothed by applying an SOC variation value having a slope greater than AvSOC.

Figure 3:
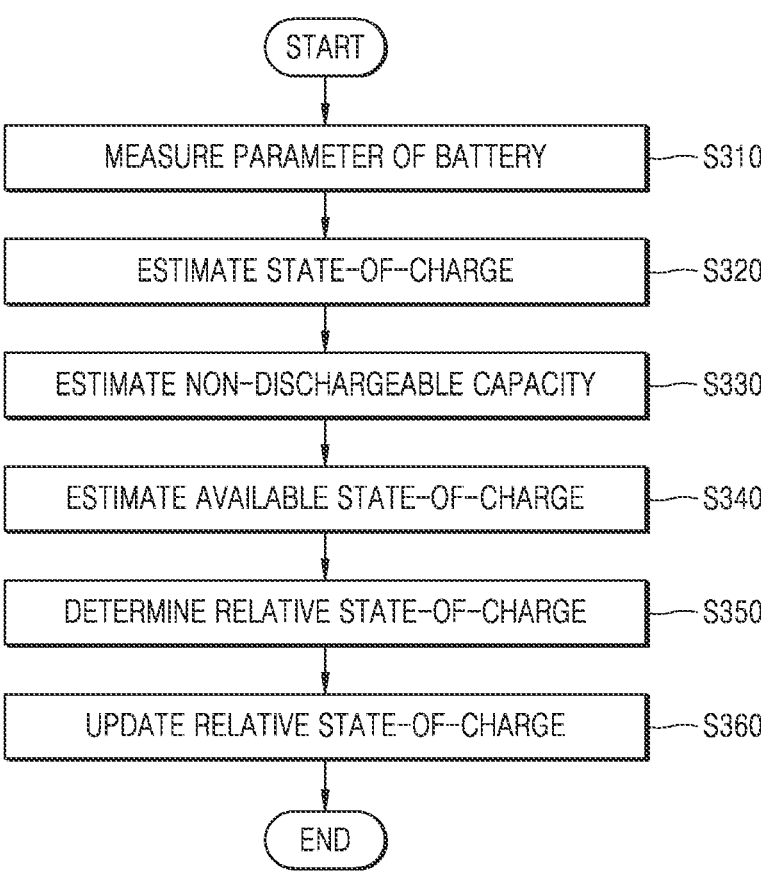
FIG. 3 is a flowchart for explaining a method of calculating an RSOC of a battery, according to one or more embodiments of the disclosure.
Figure 4:
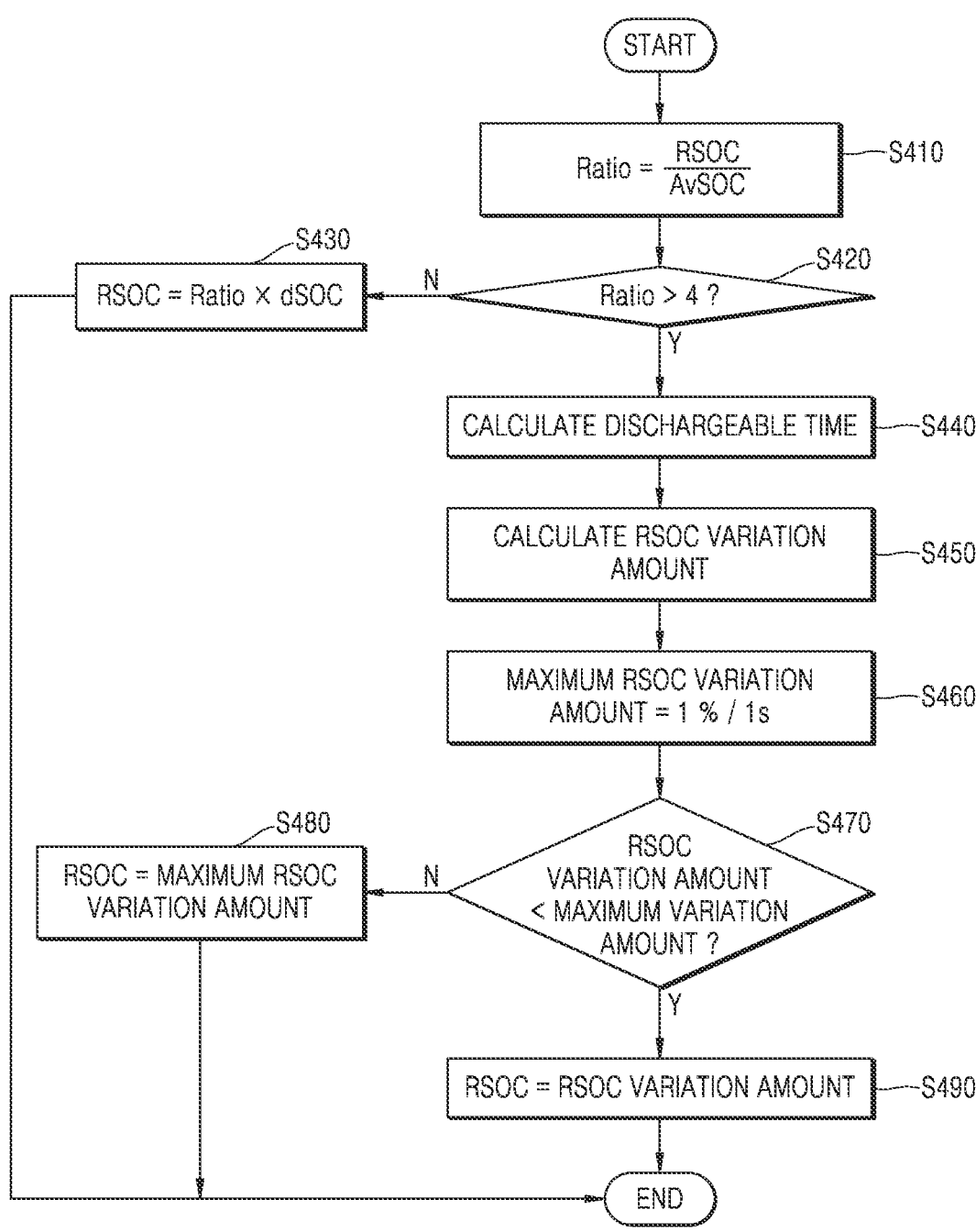
FIG. 4 is a flowchart for explaining a method of calculating an RSOC of a battery, according to one or more other embodiments of the disclosure.

FIG. 3 is a flowchart for explaining a method of calculating an RSOC of a battery, according to one or more embodiments of the disclosure. FIG. 4 is a flowchart for explaining a method of calculating an RSOC of a battery, according to one or more other embodiments of the disclosure.

A method of estimating a state of a battery, according to one or more embodiments of the disclosure, may be performed by the processor 150 shown in FIG. 1.

Referring to FIGS. 3 and 4, a method of calculating an RSOC of a battery, according to the disclosure, includes measuring at least one parameter of the battery (operation S310). Based on the at least one parameter, estimating an SOC of the battery (operation S320). Based on the SOC, based on SOC-OCV data of the battery, and based on the at least one parameter, estimating the non-dischargeable capacity of the battery (operation S330). Based on the non-dischargeable capacity, based on the SOC, and based on the intrinsic capacity of the battery, estimating an AvSOC of the battery (operation S340). Based on the SOC and the AvSOC, determining the RSOC of the battery (operation S350). And based on a ratio of the RSOC to the AvSOC, updating the RSOC (operation S360).

In one or more embodiments, the at least one parameter of the battery may include a voltage, current, and temperature of the battery. Also, the at least one parameter of the battery may include a discharge rate of the battery.

In one or more embodiments, the estimating of the non-dischargeable capacity of the battery (operation S330) may include performing a discharge simulation by using the SOC of the battery, the SOC-OCV data of the battery, and the at least one parameter, and based on a remaining capacity of the battery, which corresponds to a state-of-discharge of the battery with respect to the discharge simulation, estimating the non-dischargeable capacity of the battery. For example, the discharge simulation of the battery is a simulation performed by using the SOC and SOC-OCV data of the battery. Also, in the discharge simulation, based on Equation 6 below, a voltage drop value by the product of the internal resistance and current of the battery may be calculated by using the current, terminal voltage, SOC, and SOC-OCV data of the battery. Also, in the discharge simulation, the remaining capacity of the battery corresponding to the state-of-discharge may be calculated via an OCV value when the battery is in the state-of-discharge and the terminal voltage becomes 0, and the non-dischargeable capacity of the battery may be estimated by using the remaining capacity.

$$V = OCV - I \lambda ir \qquad \text{Equation 6}$$

Here, V refers to the terminal voltage of the battery, OCV refers to the open circuit voltage of the battery, I refers to the current of the battery, and ir refers to the internal resistance of the battery.

In one or more embodiments, the estimating of the AvSOC of the battery (operation S340) may include calculating a non-discharge rate of the battery, based on a ratio of the intrinsic capacity to the non-dischargeable capacity, and may also include calculating the AvSOC by subtracting the non-discharge rate from the SOC.

The AvSOC of the battery may be calculated by subtracting the non-discharge rate of the battery from the SOC of the battery. Here, referring to Equation 3, the non-discharge rate of the battery may be calculated based on a ratio of the intrinsic capacity and non-dischargeable capacity of the battery.

$$AvSOC = SOC - \text{non-dischargeable } SOC \qquad \text{Equation 7}$$

Here, AvSOC refers to an available state-of-charge of the battery, SOC refers to a state-of-discharge of the battery, and non-dischargeable SOC refers to SOC corresponding to the non-dischargeable remaining capacity in the current state of the battery.

In one or more embodiments, the determining of the RSOC (operation S350) may include determining the RSOC of the battery based on the SOC and AvSOC of the battery.

In one or more embodiments, referring to FIGS. 3 and 4, the updating of the RSOC (operation S360) may include calculating the ratio of the RSOC to the AvSOC (operation S410). Based on the ratio, determining whether correction of the RSOC is suitable (operation S420), and when the correction of the RSOC is suitable, updating the RSOC by using a dischargeable time of the battery.

The RSOC of the battery may be updated by using a dischargeable time of the battery when correction of the RSOC of the battery is suitable, and here, whether the correction of the RSOC is suitable is determined based on the ratio of the RSOC to the AvSOC.

$$\text{Ratio} = \frac{RSOC}{AvSOC} \qquad \text{Equation 8}$$

Here, Ratio refers to a value of a ratio of RSOC to AvSOC, RSOC refers to the relative state-of-charge of the battery, and AvSOC refers to an available state-of-charge of the battery.

Also, as shown in FIG. 4, a threshold value (e.g., predetermined threshold value) for the ratio of RSOC to the AvSOC may be about 4. Here, 4 may be a threshold value determined by experimental data.

In one or more embodiments, the determining of whether the correction of the RSOC is suitable (operation S420) may include determining whether a value of the ratio is greater than a threshold value (e.g., predetermined threshold value), and when the value of the ratio is greater than the threshold value, determining that the correction of the RSOC is suitable.

For example, when the ratio of the RSOC to the AvSOC is greater than 4, correcting of the RSOC may be performed. In contrast, when the ratio of the RSOC to the AvSOC is less than or equal to 4, the RSOC of the battery may be updated according to Equation 4 described above (operation S430).

In one or more embodiments, the updating of the RSOC (operation S360) may include calculating the dischargeable time (operation S440), calculating an RSOC variation amount by adding a variation amount weight to a value obtained by dividing a current RSOC of the battery by the dischargeable time (operation S450), and based on the RSOC variation amount, updating the RSOC.

The dischargeable time of the battery refers to a time for the battery to reach the state-of-discharge from the current state by using a relative capacity of the battery and the at least one parameter.

$$\text{Dischargeable time} = \frac{\text{relative capacity}}{\text{current current}} \qquad \text{Equation 9}$$

The RSOC of the battery may be updated based on an RSOC variation amount of the battery. Also, the RSOC variation amount of the battery may be calculated by adding a variation amount weight to a value obtained by dividing a current RSOC of the battery by the dischargeable time.

$$RSOC \text{ variation amount} = \frac{\text{current } RSOC}{\text{dischargeable time}} + a \qquad \text{Equation 10}$$

For example, the variation amount weight indicates an RSOC variation amount per unit time, and the unit thereof may be %/s (e.g., a percentage change per second).

In one or more embodiments, the updating of the RSOC by using the RSOC variation amount may include determining whether the RSOC variation amount is less than a maximum RSOC variation amount (e.g., predetermined maximum RSOC variation amount) (operation S460 and operation S470), and when the RSOC variation amount is less than the maximum RSOC variation amount, updating the RSOC of the battery by using the RSOC variation amount (operation S490). For example, as shown in FIG. 4, the maximum RSOC variation amount may be about 1%/1 s.

In contrast, when the RSOC variation amount is greater than or equal to the maximum RSOC variation amount, the RSOC of the battery may be updated by using the maximum RSOC variation amount (operation S480).

According to the disclosure, RSOC may be effectively updated based on a ratio of RSOC to AvSOC of a battery.

Figure 6:
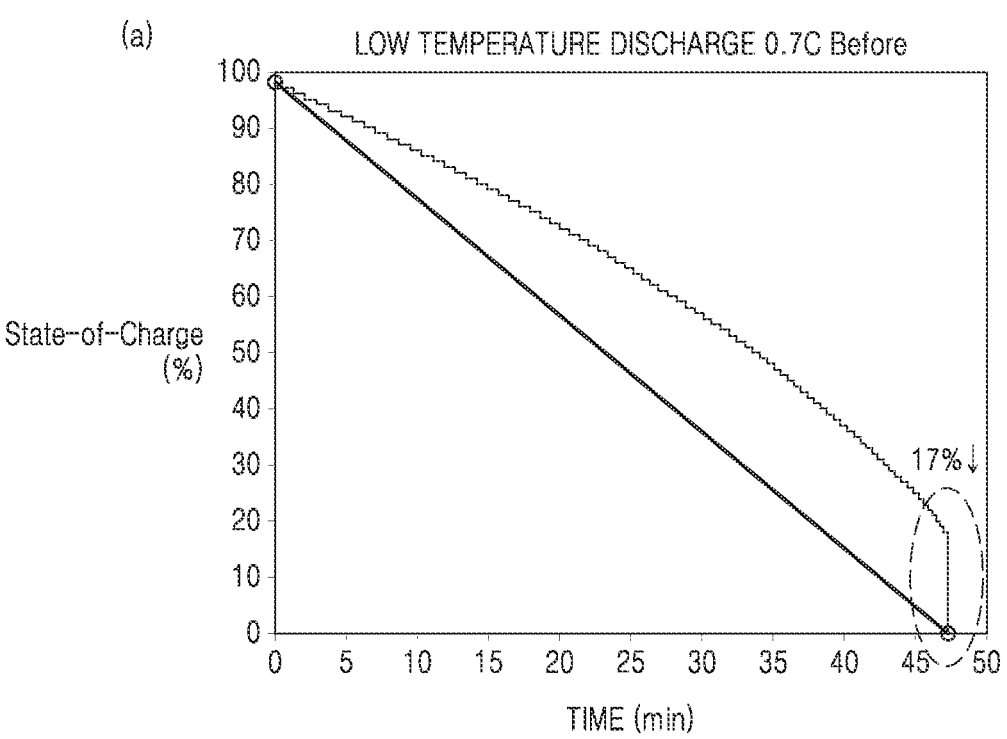
Figure 6:
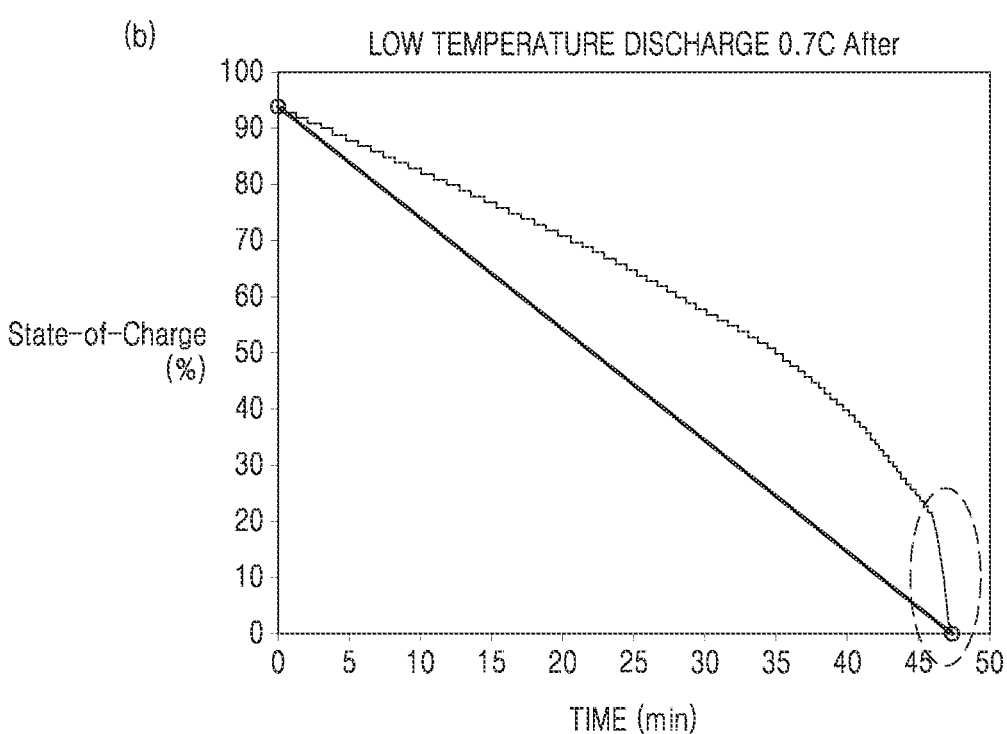
Figure 7:
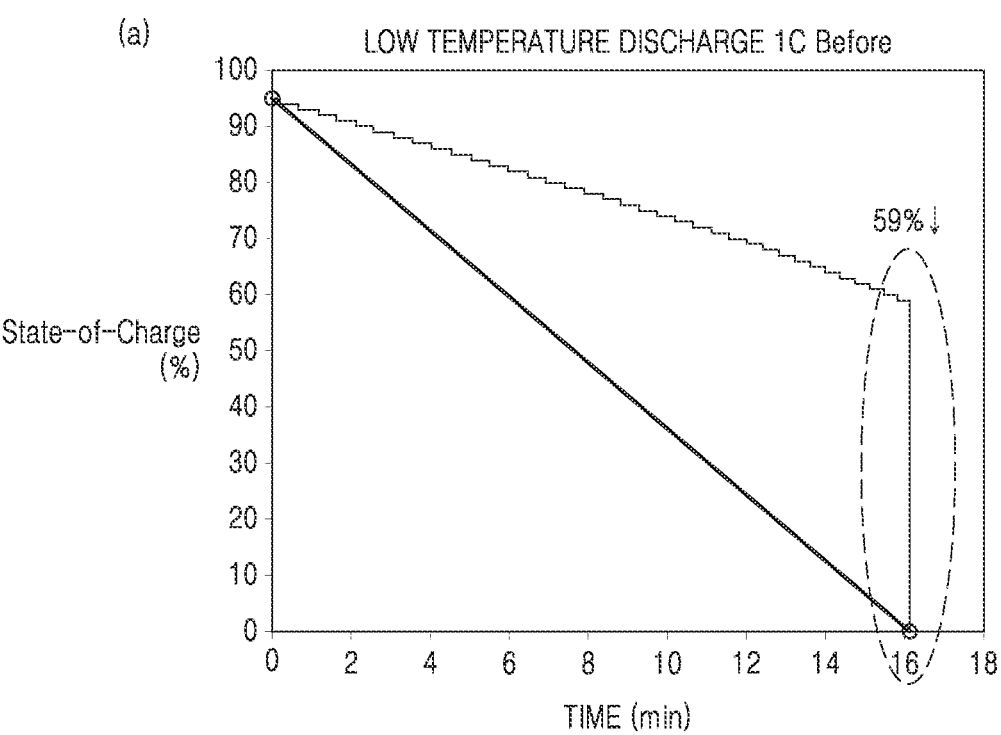
Figure 7:
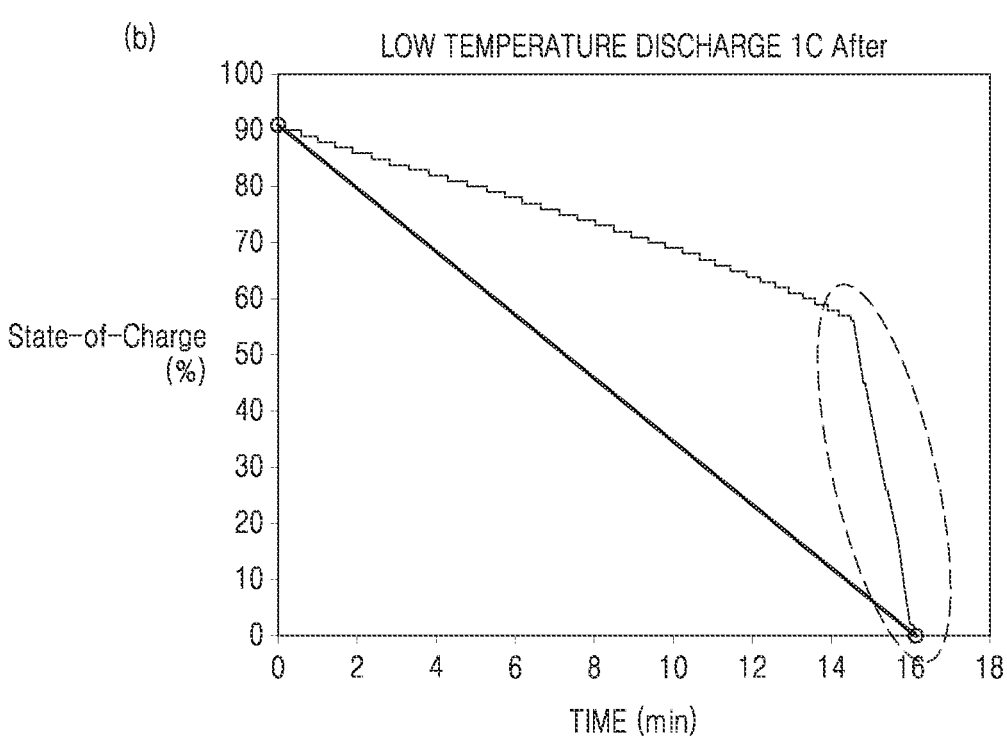

FIGS. 5 to 7 show result data and result graphs, in which updating of an RSOC according to a discharge rate of a battery is performed according to one or more embodiments of the disclosure.

First, regarding the discharge rate of the battery, a discharge rate at which the battery is discharged by using, for an hour, the rated capacity [unit of Ampere-hour (Ah)] of the battery is referred to as 1 C discharge, and a discharge rate at which the battery is discharged by using, for 10 hours, the rated capacity of the battery is referred to as 0.1 C discharge.

As shown in FIG. 5, when the discharge rates of the battery are respectively about 0.7 C and about 1.0 C, results in which the RSOC is updated according to the disclosure is shown as data.

Referring to FIGS. 5 and 6, in an experiment in which a battery in a low temperature is discharged to about 0.7 C, the discharge time is about 47 minutes and 14 seconds, the discharge capacity is about 2,651 mAh, and the discharge start RSOC is represented as about 94%. Before the RSOC update according to the disclosure is performed (a), the RSOC decreases relatively sharply from about 17% to about 0% at the end of the discharge, and after the RSOC update according to the disclosure is performed (b), the RSOC decreases from about 1% to about 0% at the end of the discharge.

Referring to FIGS. 5 and 7, in an experiment in which a battery in a low temperature is discharged to about 1.0 C, the discharge time is about 16 minutes and 7 seconds, the discharge capacity is about 1,552 mAh, and the discharge start RSOC is represented as about 91%. Before the RSOC update according to the disclosure is performed (a), the RSOC decreases relatively sharply from about 59% to about 0% at the end of the discharge, and after the RSOC update according to the disclosure is performed (b), the RSOC decreases from about 1% to about 0% at the end of the discharge.

According to the disclosure, there is an effect that may overcome a problem, such as a phenomenon in which the power of a product using a battery is suddenly turned off while the RSOC sharply decreases at the end of the battery discharge, as shown in (a) of each of FIGS. 6 and 7.

The various embodiments described hereinbefore are only examples and are not necessarily distinguished and independently implemented. The embodiments described in the present specification may be implemented in combination with each other.

The various embodiments described hereinbefore may be implemented in a form of a computer program executable by various components on a computer, and such a computer program may be recorded in a computer-readable medium. Here, the medium may continuously store computer-executable programs, or temporarily store the computer-executable programs for execution or downloading. Also, the medium may be any one of various recording media or storage media in which a single piece or plurality of pieces of hardware are combined, and the medium is not limited to a medium directly connected to a computer system, but may be distributed on a network. Examples of the medium include a magnetic medium, such as a hard disk, a floppy disk, and a magnetic tape, an optical recording medium, such as a CD-ROM and a DVD, a magneto-optical medium, such as a floptical disk, and ROM, RAM, and a flash memory, which are configured to store program instructions. Other examples of the medium include a recording medium and a storage medium managed by application stores distributing applications or by websites, servers, and the like supplying or distributing other various types of software.

In the specification, the term "unit" or "module" may be a hardware component such as a processor or circuit and/or a software component that is executed by a hardware component such as a processor. For example, the "unit" or "module" may be implemented by components, such as software components, object-oriented software components, class components, and task components, processes, functions, attributes, procedures, subroutines, segments of program code, drivers, firmware, micro codes, circuits, data, a database, data structures, tables, arrays, and variables.

According to the disclosure, a sharp decrease in RSOC, which may occur at the end of the battery discharge, may be reduced or prevented. However, the scope of the disclosure is not limited by the above aspect.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various variations in form and details may be made therein without departing from the spirit and scope of the disclosure as defined by the following claims, with functional equivalents thereof to be included therein.

What is claimed is:

1. A method of calculating a relative state-of-charge (RSOC) of a battery, the method comprising:
   measuring at least one parameter of the battery;
   based on the at least one parameter, estimating a state-of-charge (SOC) of the battery;
   based on the SOC, SOC-open circuit voltage (SOC-OCV) data of the battery, and the at least one parameter, estimating a non-dischargeable capacity of the battery corresponding to a dischargeable remaining capacity in a current state of the battery;
   based on the non-dischargeable capacity of the battery, the SOC, and intrinsic capacity of the battery, estimating an available SOC (AvSOC) of the battery;
   based on the SOC and the AvSOC of the battery, determining the RSOC of the battery; and
   based on a ratio of the RSOC to the AvSOC, updating the RSOC of the battery,
   wherein the updating of the RSOC comprises:
     calculating the ratio of the RSOC to the AvSOC;
     based on the ratio, determining whether correction of the RSOC is suitable; and
     when the correction of the RSOC is suitable, correcting the RSOC by using a dischargeable time of the battery.

2. The method of claim 1, wherein the at least one parameter comprises a voltage, current, and temperature of the battery.

3. The method of claim 1, wherein the at least one parameter comprises a discharge rate of the battery.

4. The method of claim 1, wherein the estimating of the non-dischargeable capacity of the battery comprises:

performing a discharge simulation by using the SOC, the SOC-OCV data of the battery, and the at least one parameter; and based on a remaining capacity of the battery, which corresponds to a state-of-discharge of the battery with respect to the discharge simulation, estimating the non-dischargeable capacity of the battery.

5. The method of claim 1, wherein the estimating of the AvSOC of the battery comprises:

based on a ratio of the intrinsic capacity to the non-dischargeable capacity, calculating a non-discharge rate of the battery; and calculating the AvSOC by subtracting the non-discharge rate of the battery from the SOC.

6. The method of claim 1, wherein the determining of whether the correction of the RSOC is suitable comprises:

determining whether a value of the ratio is greater than a threshold value; and when the value of the ratio is greater than the threshold value, determining that the correction of the RSOC is suitable.

7. The method of claim 1, wherein the updating of the RSOC comprises:

calculating the dischargeable time;

calculating an RSOC variation amount by adding a variation amount weight to a value obtained by dividing a current RSOC of the battery by the dischargeable time; and based on the RSOC variation amount, updating the RSOC.

8. The method of claim 7, wherein the calculating of the dischargeable time comprises calculating a time for the battery to reach a state-of-discharge from a current state by using a relative capacity of the battery and the at least one parameter.

9. The method of claim 7, wherein the updating of the RSOC by using the RSOC variation amount comprises:

determining whether the RSOC variation amount is less than a maximum RSOC variation amount; and when the RSOC variation amount is less than the maximum RSOC variation amount, updating the RSOC of the battery by using the RSOC variation amount.

10. A computer program stored in a recording medium to execute the method of claim 1 by using a computing device.

11. An apparatus for calculating a relative state-of-charge (RSOC) of a battery, the apparatus comprising:

a memory for storing data generated by measuring at least one parameter of the battery, an intrinsic capacity of the battery, and SOC-open circuit voltage (SOC-OCV) data of the battery; and at least one processor configured to, based on the at least one parameter, estimate an SOC of the battery, based on the SOC, the SOC-OCV data, and the at least one parameter, estimate a non-dischargeable capacity of the battery, configured to, based on the non-dischargeable capacity, the SOC, and the intrinsic capacity, estimate an available SOC (AvSOC) of the battery, configured to, based on the SOC and the AvSOC, determine the RSOC of the battery, and configured to, based on a ratio of the RSOC to the AvSOC, update the RSOC, wherein the RSOC is updated by using a dischargeable time of the battery when correction of the RSOC is suitable, and wherein whether the correction of the RSOC is suitable is determined based on the ratio of the RSOC to the AvSOC.

12. The apparatus of claim 11, wherein the at least one parameter comprises a voltage, current, and temperature of the battery.

13. The apparatus of claim 11, wherein the at least one parameter comprises a discharge rate of the battery.

14. The apparatus of claim 11, wherein the non-dischargeable capacity is estimated based on a remaining capacity of the battery, which corresponds to a state-of-discharge of the battery with respect to a discharge simulation of the battery, and wherein the discharge simulation is performed by using the SOC, the SOC-OCV data, and the at least one parameter.

15. The apparatus of claim 11, wherein the AvSOC is calculated by subtracting a non-discharge rate of the battery from the SOC, and wherein the non-discharge rate is calculated based on a ratio of the intrinsic capacity to the non-dischargeable capacity.

16. The apparatus of claim 11, wherein the RSOC is updated based on an RSOC variation amount of the battery, and wherein the RSOC variation amount is calculated by adding a variation amount weight to a value obtained by dividing a current RSOC of the battery by the dischargeable time.

17. The apparatus of claim 16, wherein the dischargeable time is a time for the battery to reach a state-of-discharge from a current state by using a relative capacity of the battery and the at least one parameter.

18. The apparatus of claim 16, wherein the RSOC is updated by using the RSOC variation amount when the RSOC variation amount is less than a maximum RSOC variation amount.

* * * * *